(12) United States Patent
Moshayedi

(10) Patent No.: US 6,762,487 B2
(45) Date of Patent: Jul. 13, 2004

(54) STACK ARRANGEMENTS OF CHIPS AND INTERCONNECTING MEMBERS

(75) Inventor: Mark Moshayedi, Orange, CA (US)

(73) Assignee: SimpleTech, Inc., Santa Ana, CA (US)

( * ) Notice: Subject to any disclaimer, the term of this patent is extended or adjusted under 35 U.S.C. 154(b) by 0 days.

(21) Appl. No.: 10/127,343

(22) Filed: Apr. 19, 2002

(65) Prior Publication Data

US 2002/0163786 A1 Nov. 7, 2002

Related U.S. Application Data

(60) Provisional application No. 60/285,089, filed on Apr. 19, 2001.

(51) Int. Cl.$^7$ .......................... H01L 23/48; H01L 23/52
(52) U.S. Cl. ........................ 257/686; 257/685; 257/777; 257/723; 257/680; 257/774; 257/698; 257/724; 257/778; 257/738; 257/737; 438/108; 438/109; 361/396; 361/393; 361/414; 361/403; 361/415; 361/412; 439/69; 439/74
(58) Field of Search ................................ 257/686, 685, 257/777, 723, 724, 737, 738, 778, 680, 774, 698; 438/108, 109; 361/393, 414, 403, 415, 412; 439/69, 74

(56) References Cited

U.S. PATENT DOCUMENTS

| 5,089,880 A | * | 2/1992 | Meyer et al. ................. 257/692 |
| 5,117,282 A | * | 5/1992 | Salatino ....................... 257/686 |
| 5,128,831 A | | 7/1992 | Fox, III et al. |
| 5,222,014 A | | 6/1993 | Lin |
| 5,362,679 A | | 11/1994 | Wakefield |
| 5,400,904 A | | 3/1995 | Maston, III et al. |
| 5,444,296 A | | 8/1995 | Kaul et al. |
| 5,509,200 A | | 4/1996 | Frankeny et al. |
| 5,514,907 A | | 5/1996 | Moshayedi |
| 5,591,941 A | | 1/1997 | Acocella et al. |
| 5,612,570 A | | 3/1997 | Eide et al. |
| 5,713,744 A | | 2/1998 | Laub |
| 5,751,063 A | | 5/1998 | Baba |
| 5,758,413 A | | 6/1998 | Chong et al. |
| 5,783,461 A | | 7/1998 | Hembree |
| 5,861,666 A | | 1/1999 | Bellaar |
| 5,977,640 A | * | 11/1999 | Bertin et al. ................. 257/777 |
| 6,014,316 A | | 1/2000 | Eide |
| 6,121,676 A | | 9/2000 | Solberg |
| RE36,916 E | | 10/2000 | Moshayedi |
| 6,130,823 A | | 10/2000 | Lauder et al. |
| 6,225,688 B1 | | 5/2001 | Kim et al. |
| 6,323,546 B2 | * | 11/2001 | Hsuan et al. ................. 257/686 |
| 6,414,391 B1 | * | 7/2002 | Corisis et al. ............... 257/738 |
| 6,417,027 B1 | * | 7/2002 | Akram ....................... 438/109 |
| 6,473,308 B2 | | 10/2002 | Forthun |
| 2002/0030261 A1 | * | 3/2002 | Rolda et al. ................. 257/685 |
| 2002/0079568 A1 | * | 6/2002 | Degani et al. ............... 257/686 |

FOREIGN PATENT DOCUMENTS

| JP | 6-77644 | 3/1994 |
| TW | 411540 | 11/2000 |
| WO | WO 98/25301 | 6/1998 |
| WO | WO 99/57765 | 11/1999 |

OTHER PUBLICATIONS

Edge–Mounted MLC Packaging Scheme, IBM Technical Disclosure Bulletin, vol, 23, No. 12, May 1981.

* cited by examiner

Primary Examiner—Alexander Oscar Williams

(57) ABSTRACT

A method and structures for vertically interconnecting a plurality of chips to provide increased volume circuit density for a given surface chip footprint. One aspect is a stack of two chips with a preformed interconnecting support connecting the two chips and with space for mounting a third chip to at least one of the other two chips in an interstitial space between the two chips and inside the support. Another aspect is a chip stack where two smaller chips are interconnected a larger third chip on both sides thereof and further with interconnecting structures extending beyond the extent of either of the two chips as attached to the third chip. Yet another aspect is a chip stack of at least two chips interconnected to each other with a smaller third chip positioned therebetween and interconnected with at least one of the larger two chips.

12 Claims, 4 Drawing Sheets

STACK ARRANGEMENTS OF CHIPS AND INTERCONNECTING MEMBERS

RELATED APPLICATIONS

This application claims the benefit of the U.S. provisional application 60/285,089 filed Apr. 19, 2001, entitled "CHIP STACK AND METHOD OF MAKING SAME".

BACKGROUND OF THE INVENTION

1. Field of the Invention

The invention relates to the field of integrated circuit interconnections and, in particular, to structures and methods for vertically stacking chips for increased volume density without increased footprint.

2. Description of the Related Art

Modern electronic devices, such as computers and the like, typically include integrated circuits encapsulated in packages generally referred to generically as "chips". Chips are generally planar structures and typically include a plurality of conducting pads disposed as surface contacts about a surface of the chip and/or "pins" along an edge thereof. The conducting pads generally interconnect to a plurality of interconnecting conductive traces that extend from the pads to the electronic devices within the chip and allow interconnection of the electronic devices to external circuits to allow a system level circuit.

With advances in semiconductor device processing has come a continuing increase in device count and density within chips and this has driven a corresponding increase in the count and density of the external conducting pads. Current technology places a limit on how small external contacts can be made and how closely they can be placed adjacent one another while still maintaining circuit integrity. Limits are imposed both by the limitations of machinery to form ever smaller conductive elements and the reduction in production yield as the limits are pushed.

An additional concern is an overall system level consideration of packaging. As previously mentioned, chips are generally planar structures with relatively thin, flat profile. A common practice has been to interconnect chips on another generally planar support structure often referred to as a "mother board". However, the desire to provide the capability of integrated circuits to relatively small devices limits the extent to which multiple chips can be laterally interconnected while still fitting within the device. In addition, lateral extension and interconnection of chips tends to lead to relatively long interconnects between chips and thus between circuit components thus introducing propagation delays that can limit the practical speed of operation of the system level circuits.

From the foregoing, it can be appreciated that there is an ongoing need for structures and methods for interconnecting chips to increase circuit density without increasing the chip footprint and with minimal increase in interconnection length.

SUMMARY OF THE INVENTION

The aforementioned needs are satisfied by the invention which in one aspect is various structures and methods for interconnecting a plurality of generally planar chips in a vertical stack such that the stack chips define interstitial spaces that provide clearance for additional chips to be placed therein. The various structures and methods include the aspect that the total footprint of the stack does not exceed the footprint of the single largest component chip.

A certain aspect of the invention is a chip stack of a preformed support structure vertically interconnecting a first chip to a second chip with a third chip interposed therebetween wherein the support structure comprises a rigid annular housing defining an opening adapted to provide clearance for the third chip and a plurality of conductor cavities disposed about the periphery of the housing and extending between a first face and an opposite second face of the housing and a plurality of conductive elements positioned within the conductor cavities such that a portion of each conductive element extends slightly beyond the first and second faces of the housing so as to interconnect the first and second chips and such that each of the conductive element extends substantially flush with the edges of the conductor cavities on the first and second faces of the housing so as to substantially fill the corresponding conductor cavity. A particular aspect therein is wherein the conductor cavities of the support structure are substantially rectangular in horizontal cross-section or more particularly wherein the conductor cavities of the support structure are substantially square in horizontal cross-section.

Other aspects of the invention are wherein walls of the conductor cavities are substantially parallel to other conductor cavity walls along their adjacency to the adjacent conductor cavities and/or wherein the conductor cavities define first opposing walls facing adjacent conductor cavities and second opposing walls between the first walls wherein the first walls are generally planar and parallel to the first walls of adjacent conductor cavities and wherein the second walls are generally convexly curved.

The invention also includes the aspects of a preformed support structure for vertically interconnecting a first chip to a second chip with a third chip interposed therebetween wherein the support structure comprises a rigid annular housing defining an opening adapted to provide clearance for the third chip and a plurality of conductor cavities disposed about the periphery of the housing and extending between a first face and an opposite second face of the housing and a plurality of conductive elements positioned within the conductor cavities such that a portion of each conductive element extends slightly beyond the first and second faces of the housing and such that each of the conductive element extends substantially flush with the edges of the conductor cavities on the first and second faces of the housing so as to substantially fill the corresponding conductor cavity. A particular aspect therein is wherein the conductor cavities of the support structure are substantially rectangular in horizontal cross-section and more particularly wherein the conductor cavities of the support structure are substantially square in horizontal cross-section.

The invention further includes the aspect wherein walls of the conductor cavities are substantially parallel to other conductor cavity walls along their adjacency to the adjacent conductor cavities and wherein the conductor cavities define first opposing walls facing adjacent conductor cavities and second opposing walls between the first walls wherein the first walls are generally planar and parallel to the first walls of adjacent conductor cavities and wherein the second walls are generally convexly curved.

The invention is also a method of interconnecting chips having surface contacts comprising forming a generally annular support structure with a plurality of conductor cavities extending between opposite faces of the support structure and aligned with the surface contacts, filling the conductor cavities with conductive material such that the conductive material substantially fills the conductor cavities and extends slightly beyond the opposite faces of the support structure, placing chips on the support structure such that the surface contacts are adjacent and aligned with the conductor cavities so as to form a stack of the chips and the support structure, and processing the stack so as to induce the conductive material to connect to the surface contacts.

Yet another aspect of the invention is a chip stack of at least a first, a second, and a third chip and conductive interconnecting structures of at least a first size and a second smaller size interconnecting the chips wherein the third chip has a smaller footprint than either of the first or second chips and wherein the first conductive structures interconnect the first and second chips so as to define an interstitial space therebetween and the third chip is connected to at least one of the first and the second chips via the second conductive structures and is positioned within the interstitial space such that the vertical extent of the first conductive support structures is greater than the combined vertical extent of the third chip and the second conductive support structures. Particularly therein, the invention includes wherein the third chip is connected to one of the first or the second chips via the second conductive structures.

An additional aspect of the invention is a chip stack of at least a first, a second, and a third chip and conductive interconnecting structures of a first size interconnecting the first and second chips to the third chip wherein the third chip has a larger footprint than either of the first or second chips and further comprising second conductive support structures connected to the third chip such that the vertical extent of the second conductive support structures is greater than the combined vertical extent of either the first or second chips and the associated first conductive support structures.

These and other objects and advantages of the present invention will be more apparent from the following description taken in conjunction with the accompanying drawings.

DETAILED DESCRIPTION OF THE PREFERRED EMBODIMENT

Figure 1:
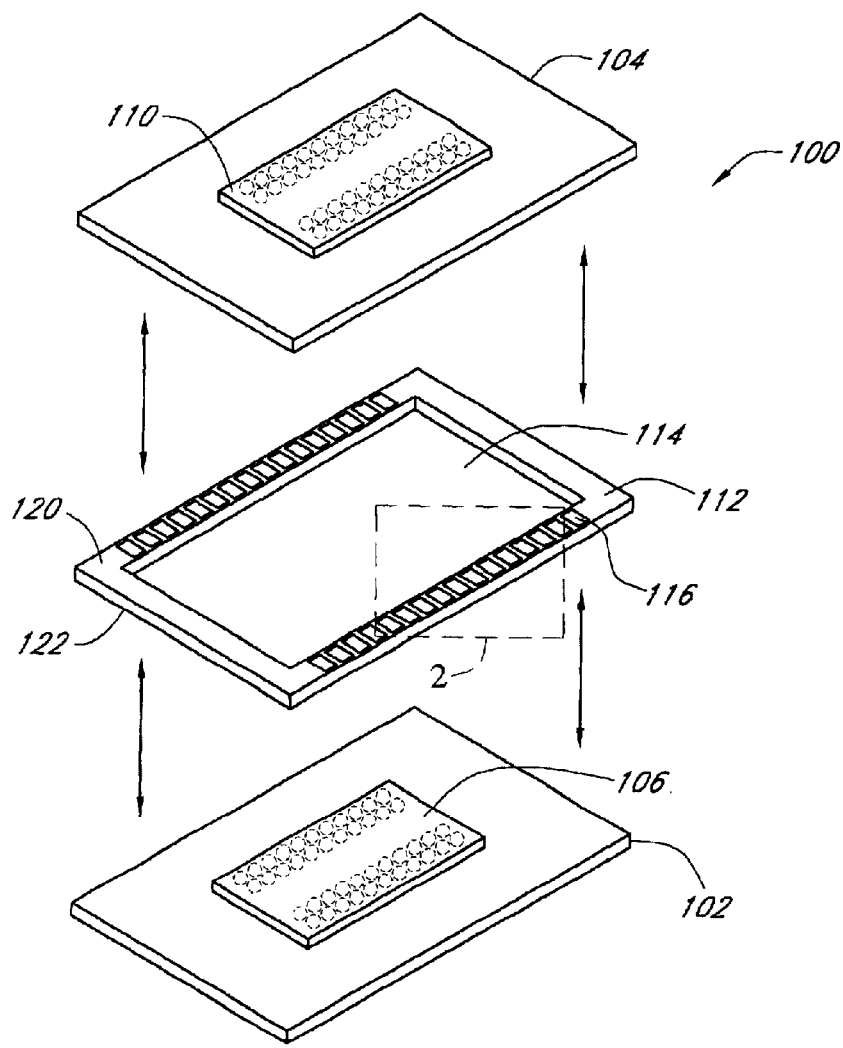
FIG. 1 is an exploded, perspective view of one embodiment of a preformed support structure vertically interconnecting a first chip to a second chip with a third chip interposed therebetween.

Reference will now be made to the drawings wherein like numerals refer to like parts throughout. FIG. 1 is an exploded, perspective view of one embodiment of a chip stack 100 of the invention. The chip stack 100, in this embodiment, comprises a first chip 102, a second chip 104 and a third chip 106. The chip stack 100 as illustrated in FIG. 1 further comprises a fourth chip 110. The chips 102, 104, 106, 110 comprise packaged integrated circuits with exposed contacts of types generally well known in the art.

The chip stack 100 also comprises a preformed support 112 vertically interconnecting the first chip 102 and the second chip 104. The support 112 in this particular embodiment is generally rectangular and is sized to generally match the shape and size of the first 102 and second 104 chips. The support 112 is also annular, defining an internal opening 114. The opening 114 in this particular embodiment is also generally rectangular and sized to provide clearance for the third chip 106 within the opening 114. The support 112 is made of a rigid, non-conducting material.

The support 112 also includes a plurality of conductor cavities 116. The conductor cavities 116 extend generally vertically between a first face 120 and an opposite second face 122 of the support 112. The conductor cavities 116 are substantially filled with a conductive material 124. In certain embodiments, the conductive material 124 comprises a metal of relatively low melting point, such as solder and in alternative embodiments, the conductive material 124 comprises a conductive adhesive material, such as epoxy. An advantageous aspect of this embodiment is that the support 112 is provided in a preformed manner with the conductor cavities 116 substantially filled with the conductive material 124. This aspect of this embodiment facilitates alignment of the conductive material 124 within the rigid support 112 and maintains the alignment as the first 102 and second 104 chips are interconnected via the support 112 in a manner that will be described in greater detail below.

Figure 2:
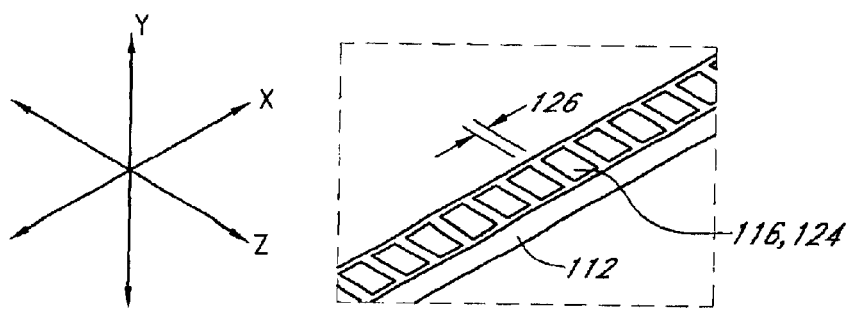
FIG. 2 is a detail, perspective view of a portion of one embodiment of the preformed support structure of FIG. 1 wherein conductor cavities of the support have a generally square cross-section.
Figure 3:
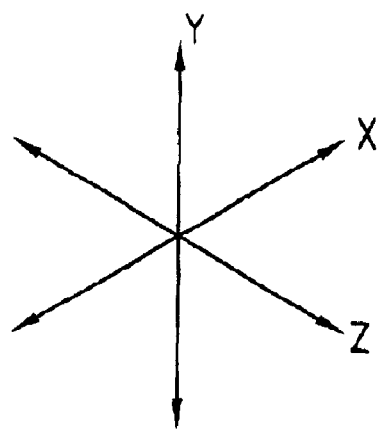
FIG. 3 is a detail, perspective view of a portion of another embodiment of the preformed support structure of FIG. 1 wherein conductor cavities of the support have generally planar walls generally parallel to the walls of adjacent cavities and a generally convex outward curve on the sides between the planar sides.
Figure 3:
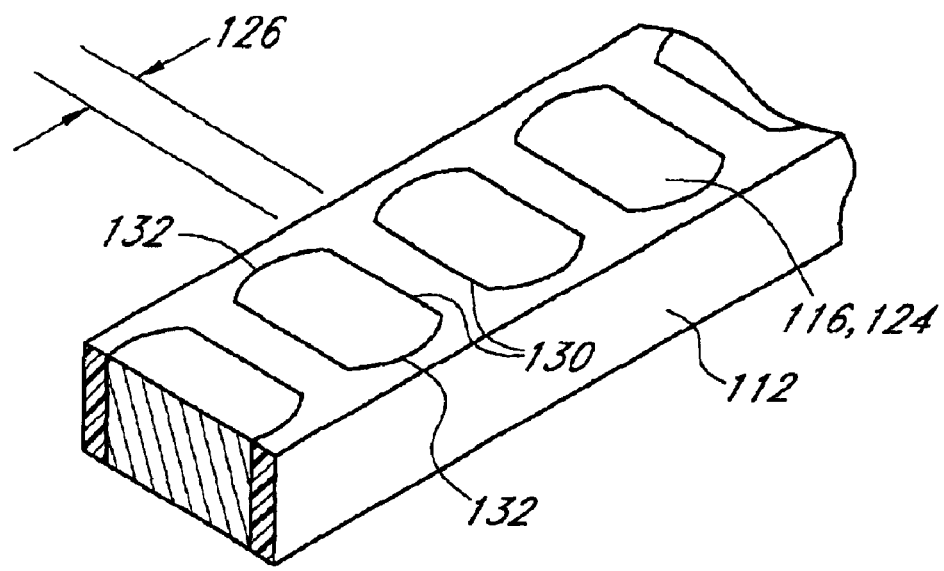

The conductor cavities 116 are disposed mutually aligned with contacts 142 of the first 102 and second 104 chips arrayed in a first pattern about the periphery of the support 112 (corresponding to the periphery of the first 102 and second 104 chips) with a spacing 126 as shown in FIGS. 2 and 3. As understood herein, the spacing 126 is the lateral separation between adjacent conductor cavities 116 as filled with the conductive material 124 as considered generally orthogonal to the generally vertical orientation of the conductor cavities 116. It is to be understood that the terms "vertical" and "vertically" as used herein refer to a generally orthogonal orientation with respect to the major plane of the chips.

As shown in FIGS. 2 and 3, the conductor cavities 116 extend generally along the y-axis and have generally planar first walls 130 aligned generally along the y-z plane. The conductor cavities 116 also have second walls 132 between the first walls 130. In the embodiment shown in FIG. 2, the first walls 130 and second walls 132 are generally planar and respectively parallel to each other. The first walls 130 are also perpendicular to the second walls 132 such that the conductor cavities 116 are generally rectangular in cross-section as considered along the horizontal x-z plane. In certain embodiments, the conductor cavities 116 are square in cross-section. It should also be understood that in further embodiments, the conductor cavities 116 can be circular, oval, or other cross-sectional shapes without detracting from the spirit of the invention.

It will be understood that the conductor cavities 116 filled with the conductive material 124 define signal lines conducting signals between the various electronic devices of the various chips 102, 104, 106, 110. It is generally essential to proper circuit operation that each of the plurality of conductive cavities 116 filled with conductive material 124 maintain signal integrity. Cross-talk between the conductor cavities 116 should preferably be inhibited. Cross-talk can arise because of conductive material 124 bridging across conductor cavities or excessive electric field intensity causing arcing across adjacent conductor cavities. Thus, the spacing 126 between adjacent conductor cavities 116 as filled with the conductive material 124 is subject to lower limits. In particular, a lower limit to the spacing 126 will be imposed by process limitations to forming smaller conductor cavities 116 or closer spacing 126 while maintaining reliable conductive integrity therethrough.

However, there is also a desire to increase conductivity of the conductor cavities 116 filled with conductive material 124 to reduce signal loss. One manner of increasing the conductivity is to increase the cross-sectional area of the conductor cavities 116, thereby increasing the available volume for filling the cavities 116 with the conductive material 124. Within a given width and thickness envelope, i.e. along the x and z directions, for placement of the conductor cavities 116, a square cross-sectional aspect of the conductor cavities 116 as shown in FIG. 2 will increase the available conductive material 124 for signal transmission and thus increase the conductance thereof.

FIG. 3 illustrates an alternative embodiment of configuration for the conductor cavities 116 that may be advantageous in certain applications. In particular, the conductor cavities 116 of FIG. 3 have first walls 130 that are generally planar and mutually parallel. The second walls 132, positioned between the first walls 130, in this embodiment, are convexly curved. This embodiment offers the advantage that the junction between the first 130 and second 132 walls has a larger radius of curvature, i.e. is less sharp. Thus a potential difference between conductor cavities 116 filled with conductive material 124 will result in a lower electric field intensity adjacent the conductor cavities 116 than an otherwise equivalent case with sharper corners thus reducing the likelihood of arcing across conductor cavities 116 of reduced dimensions and smaller spacing 126. In certain applications, the embodiment of conductor cavities illustrated in FIG. 3 may also offer advantages in manufacturing ease as opposed to embodiments with sharper corners between first 130 and second 132 walls.

In order to form the chip stack 100, the chips 102, 104, 106, 110 are preferably provided with a plurality of surface mount contacts 142, 144 comprising solder balls or bumps of types generally well known in the art such that the solder balls or bumps are positioned mutually aligned with respect to each other such that the third chip 106 is generally centered on a face of the first chip 102 and that contacts 144 of the first 102 and third 106 chips are aligned in a second pattern as well as contacts 142 of the first 102 and second 104 chips aligned in a first pattern. The third chip 106 is attached to the first chip 102 by positioning the first chip 102 adjacent the third chip 106 so as to achieve alignment between the plurality of solder balls/bumps thereof. The first 102 and third 106 chips are then processed to induce the solder balls/bumps to partially liquefy and reflow and subsequently the first 102 and third 106 chips are further processed to induce the solder to resolidify thereby mutually affixing and interconnecting the first 102 and third 106 chips via the contacts 144.

The support 112 is then placed between the first 102 and second 104 chips such that the third chip 106 is positioned within the internal opening 114 of the support 112 and such that the contacts 142 disposed about the periphery of the first 102 and second 104 chips are aligned with the conductor cavities 116. In embodiments wherein the conductive material 124 is solder, the support 112 and first 102 and second 104 chips are then exposed to a heat process to induce the solder to partially liquefy and then allowed to cool to form a solder joint between the first 102 and second 104 chips at the contacts 142 via the support 112 with the preformed conductive material 124 in the conductor cavities 116. In embodiments wherein the conductive material 124 comprises a conductive adhesive, the support 112 and first 102 and second 104 chips are maintained in alignment until the adhesive components of the conductive material 124 set.

Figure 4:
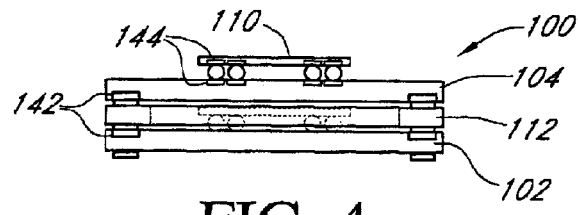
FIG. 4 is a side view of one embodiment of a preformed support structure vertically interconnecting a first chip to a second chip with a third chip interposed therebetween.

FIG. 4 illustrates an embodiment of the invention wherein the fourth chip 110 is attached to the second chip 104 in a similar manner to the connection of the third chip 106 to the first chip 102. The fourth chip 100 can be attached to the second chip 104 in the manner previously described for the first 102 and third 106 chips either before or after the interconnection of the first 102 and second 104 chips. It will be appreciated that in additional embodiments, additional layers of supports 112 and chips could be formed to extend the height of and number of chips in the chip stack 100 in the manner previously described.

Figure 5:
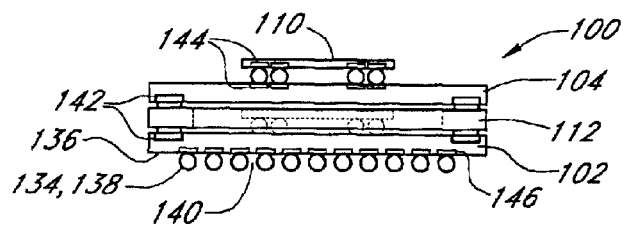
FIG. 5 is a side view of another embodiment of a preformed support structure vertically interconnecting a first chip to a second chip with a third chip interposed therebetween.

FIG. 5 illustrates a further embodiment of the invention otherwise similar to the embodiments described with respect to FIGS. 1–4 and further comprising a plurality of conductive supports 134 are attached to a lower face 136 of the first chip 102 at contacts 146. In certain embodiments, the conductive supports 134 comprise balls or bumps of solder and, in other embodiments, a conductive, adhesive material such as conductive epoxy 138. As can be seen in FIG. 5, the conductive supports 134 extend beyond the lower face 136 a vertical distance. In embodiments wherein the conductive supports 134 are generally positioned about the periphery of the lower face 136 of the first chip 102, the conductive supports 136 define an interstitial space 140. The interstitial space 140 provides clearance for the attachment of additional chips to the lower face 136 of the first chip 102 in a similar manner to that in which the internal opening 114 of the support 112 provides clearance for the third chip 106 on an upper face 142 of the first chip 102.

The conductive supports 134 also provide mechanism for attaching the lower face of the first chip 102 to other chips or structures that have a footprint at least generally as large as that of the first chip 102. It will be appreciated that the various electronic devices of the chips 102, 104, 106, 110 can thus be interconnected to underlying circuits or structures without exceeding the footprint of the single first chip 102. These aspects of the invention facilitate efficient attachment of the first chip 102 and thus the chip stack 100 to other electronic structures or devices.

Figure 6:
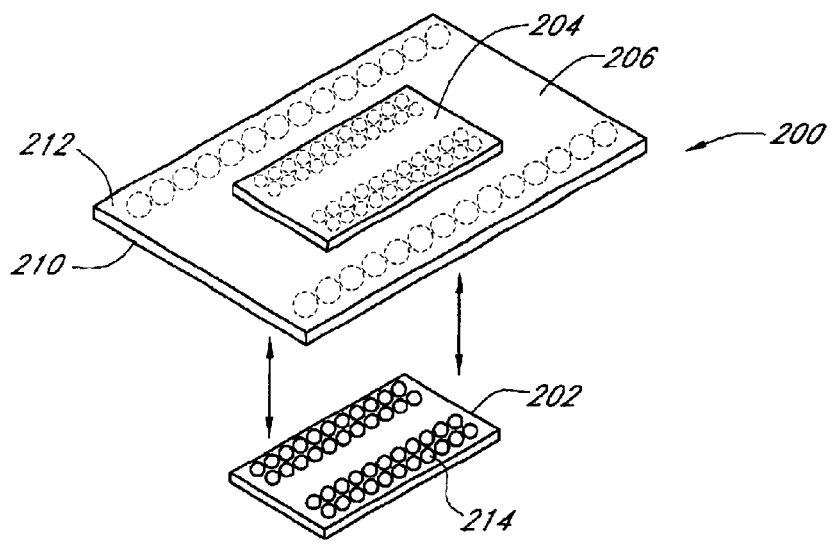
FIG. 6 is an exploded perspective view of one embodiment of a chip stack of at least a first, a second, and a third chip and conductive interconnecting structures of at least a first size and a second smaller size interconnecting the chips.

FIG. 6 is an exploded, perspective view of another embodiment of a chip stack 200. The chip stack 200 comprises a first chip 202, a second chip 204, and a third chip 206. The chips 202, 204, and 206 are similar to the chips 102, 104, 106, 110 previously described being encapsulated integrated circuits of types generally well known in the art. The chips 202, 204, 206 are also provided with a plurality of contacts 220, 222 of types well known in the art as previously described for the chip stack 100. The contacts 220 of the first 202 and second 204 chips are arrayed in a first pattern aligned with contacts 220 on a lower 210 and an upper 212 face respectively of the third chip 206.

In this embodiment, the first 202 and second 204 chips have smaller footprints than that of the third chip 206. The first contacts 220 of the third 206 chips are positioned generally centrally on the lower 210 and upper 212 faces of the third chip 206.

The chip stack 200 also comprises a plurality of first conductive interconnecting structures 214. The first interconnecting structures 214 in this embodiment comprise balls/bumps of solder arrayed about a face of the first 202 and second 204 chips and aligned with the contacts 222 thereof. The first interconnecting structures 214 are aligned between the contacts 220 of the first chip 202 and the first contacts 220 on the lower face 210 of the third chip 206 and between the contacts 220 of the second chip 204 and the first contacts 220 on the upper face 212 of the third chip 206. The first interconnecting structures 214 and the chips 202, 204, 206 are processed to induce the first interconnecting structures 214 to partially liquefy and then allowed to cool so as to form a solder joint between the first 202 and third 206 and the second 204 and third 206 chips at the contacts 220.

The third chip 206 also comprises a plurality of second contacts 222 disposed about the lower face 210 and positioned outside the attachment of the first chip 202 to the third chip 206. The chip stack 200 also comprises a plurality of second interconnecting structures 216 similar in composition and form to the first interconnecting structures 214. However, the first interconnecting structures 214 are of a first size and the second interconnecting structures 216 are of a larger second size. In particular, the vertical dimension of the second interconnecting structures 216 is greater than the combined vertical dimension of the first chip 202 and the first interconnecting structures 214 as interconnecting the first 202 and the third 206 chips.

Figure 7:
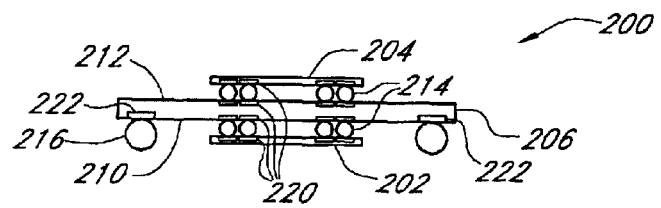
FIG. 7 is a side view of the chip stack of FIG. 6.

Thus, as can be seen in FIG. 7, the second interconnecting structures extend vertically beyond the first chip 202 as interconnected to the third chip 206. The second interconnecting structures 216 facilitate interconnection of the third chip 206, and thus as desired, the first 202 and second 204 chips, via the third chip 206, to an underlying chip or structure. These aspects provide alternative efficient interconnection mechanism for connecting a plurality of chips 202, 204, 206 to an underlying structure without exceeding the footprint of the largest single (third 206) chip.

Figure 8:
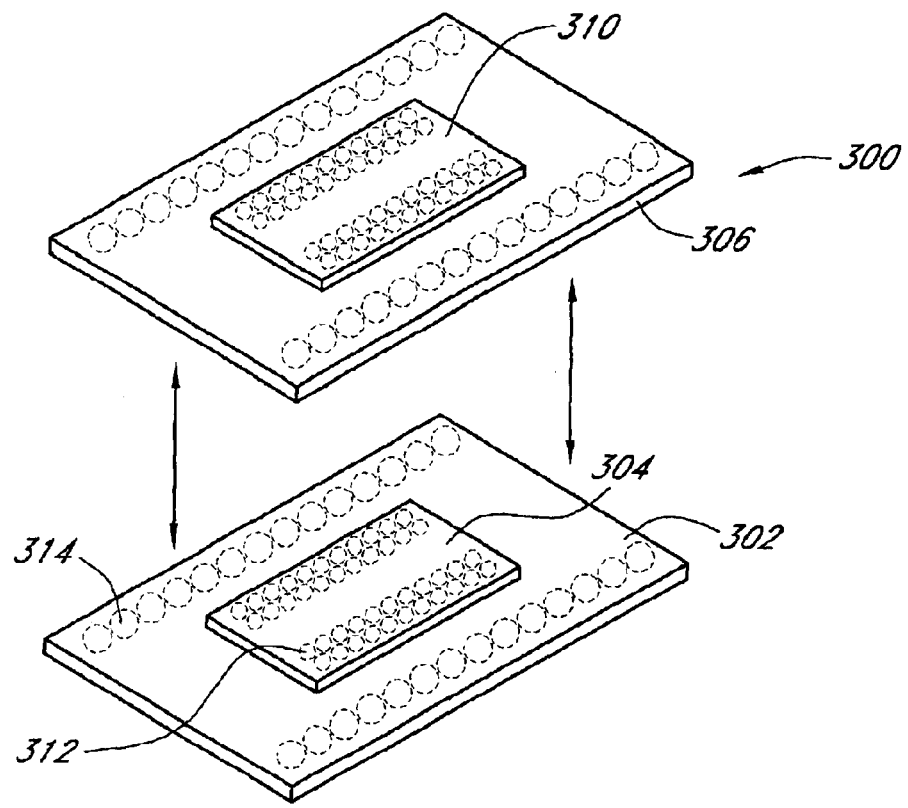
FIG. 8 is an exploded perspective view of one embodiment of a chip stack of at least a first, a second, and a third chip and conductive interconnecting structures of a first size interconnecting the first and second chips to the third chip.
Figure 9:
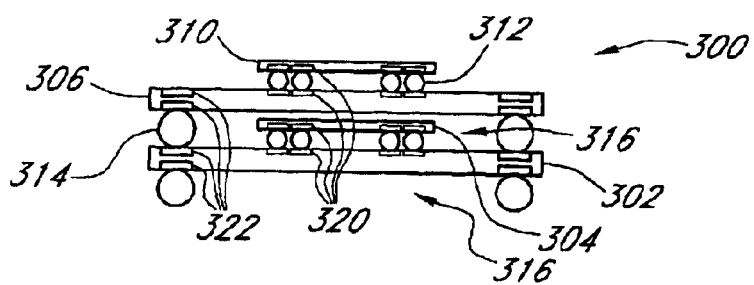
FIG. 9 is a side view of the chip stack of FIG. 8.

FIGS. 8 and 9 illustrate an additional alternative embodiment of a chip stack 300. The chip stack 300 comprises a first chip 302, a second chip 204, a third chip 306, and a fourth chip 310. The chips 302, 304, 306, 310 are generally planar encapsulated integrated circuits of types well known in the art. In this embodiment, the first 302 and the third 306 chips and the second 304 and the fourth 310 chips respectively have substantially similar footprints. The chip stack 300 also comprises first 312 and second 314 interconnecting structures. The interconnecting structures 312, 314 comprise solder balls/bumps and the first interconnecting structures 312 are of a first size and the second interconnecting structures 314 are of a second larger size. In particular, the second interconnecting structures 314 are larger in vertical dimension than the combined vertical dimension of the first interconnecting structures 312 and one of the chips 304, 310.

The chips 302, 304, 306, 310 comprise contacts 320, 322 disposed about faces of the chips 302, 304, 306, 310. In this embodiment, first contacts 320 are disposed on upper faces of the first 302 and third 306 chips and on lower faces of the second 304 and fourth 310 chips such that the first contacts 320 are aligned between the respective faces of the first 302 and second 304 chips and between the third 306 and fourth 310 chips.

The chips 302, 306 also comprise second contacts 322 disposed on vertically corresponding positions on opposing upper and lower faces of the chips 302, 306. The second contacts 322 are disposed generally about the periphery of the chips 302, 306 and outside the footprint of the chips 304 and 310.

The chip stack 300 is formed by positioning first interconnecting structures 312 so as to be aligned between the first contacts 320 of the first 302 and second 304 chips as well as between the third 304 and the fourth 310 chips. Second interconnecting structures 314 are further positioned so as to be aligned between the second contacts 322 of the first 302 and third 306 chips. The chips 302, 304, 306, 310 and first 312 and second 314 interconnecting structures are then processed so as to induce the first 312 and second 314 interconnecting structures to partial liquefy and then allowed to cool so as to resolidify and form solder joints between the chips 302, 304, 306, 310 via the contacts 320, 322.

It can be seen in FIG. 9, that as the second interconnecting structures 314 are greater in vertical dimension than the combined vertical dimension of either the second 304 or fourth 310 chips plus the vertical dimension of a first interconnecting structure 312, the attachment of the first 302 and third 306 chips via the second interconnecting structures 314 defines an interstitial space 316. The interstitial space 316 provides clearance for the second chip 304 between the first 302 and third 306 chips. It can be appreciated that additional layers of chips and first 312 and second 314 interconnecting structures can be added to the chip stack 300 creating additional interstitial spaces 316 in alternative embodiments of the invention.

Although the foregoing description of the preferred embodiment of the present invention has shown, described, and pointed out the fundamental novel features of the invention, it will be understood that various omissions, substitutions, and changes in the form of the detail of the apparatus as illustrated, as well as the uses thereof, may be made by those skilled in the art without departing from the spirit of the present invention.

What is claimed is:

1. A chip stack of a preformed support structure vertically interconnecting a first chip to a second chip with a third chip interposed therebetween wherein the support structure comprises:

a housing having a first and second face and defining an opening and a periphery wherein a plurality of conductor cavities are disposed about the periphery of the housing and extend between the first face and the second face of the housing; and a plurality of conductive elements positioned within the conductor cavities such that a portion of each conductive element extends slightly beyond the first and second faces of the housing so as to interconnect the first and second chips and is substantially uniform in cross-sectional area along a vertical extent between the first and second chips and such that each of the conductive element extends substantially flush with the edges of the conductor cavities on the first and second faces of the housing so as to substantially fill the corresponding conductor cavity.

2. The chip stack of claim 1, wherein the conductor cavities of the support structure are substantially rectangular in horizontal cross-section.

3. The chip stack of claim 2, wherein the conductor cavities of the support structure are substantially square in horizontal cross-section.

4. The chip stack of claim 1, wherein walls of the conductor cavities are substantially parallel to other conductor cavity walls along their adjacency to the adjacent conductor cavities.

5. The chip stack of claim 1, wherein the conductor cavities define first opposing walls facing adjacent conductor cavities and second opposing walls between the first walls wherein the first walls are generally planar and parallel to the first walls of adjacent conductor cavities and wherein the second walls are generally convexly curved.

6. A preformed support structure for vertically interconnecting a first chip to a second chip with a third chip interposed therebetween wherein the support structure comprises:
- a rigid annular housing defining an opening providing clearance for the third chip and a plurality of conductor cavities disposed about the periphery of the housing and extending between a first face and an opposite second face of the housing; and
- a plurality of conductive elements positioned within the conductor cavities such that a portion of each conductive element extends slightly beyond the first and second faces of the housing and such that each of the conductive element is substantially uniform in cross-sectional area along a vertical extent between the first and second chips and extends substantially flush with the edges of the conductor cavities on the first and second faces of the housing so as to substantially fill the corresponding conductor cavity.

7. The support structure of claim 6, wherein the conductor cavities of the support structure are substantially rectangular in horizontal cross-section.

8. The support structure of claim 7, wherein the conductor cavities of the support structure are substantially square in horizontal cross-section.

9. The support structure of claim 6, wherein walls of the conductor cavities are substantially parallel to other conductor cavity walls along their adjacency to the adjacent conductor cavities.

10. The support structure of claim 6, wherein the conductor cavities define first opposing walls facing adjacent conductor cavities and second opposing walls between the first walls wherein the first walls are generally planar and parallel to the first walls of adjacent conductor cavities and wherein the second walls are generally convexly curved.

11. A method of interconnecting chips having surface contacts comprising:
- forming a generally annular support structure with a plurality of conductor cavities extending between opposite faces of the support structure and aligned with the surface contacts;
- filling the conductor cavities with conductive material such that the conductive material substantially fills the conductor cavities and extends slightly beyond the opposite faces of the support structure and is substantially uniform in cross-sectional area along a vertical extent;
- placing chips on the support structure such that the surface contacts are adjacent and aligned with the conductor cavities so as to form a stack of the chips and the support structure; and
- processing the stack so as to induce the conductive material to connect to the surface contacts.

12. A chip stack comprising;
- a first chip having a first and second side wherein the first chip comprises a first set of contacts formed on the first side;
- a second chip having a first and second side wherein the second chip comprises a first set of contacts formed on the first side;
- a first interconnecting member with a first and a second side, wherein the first interconnecting member comprises a first set of contacts formed on the first side and a second set of contacts formed on the second side and wherein the first set of contacts interconnect the first set of contacts on the first chip;
- a second interconnecting member having a first and a second side, wherein the second interconnecting member defines an opening and a periphery surrounding the opening and wherein the interconnecting member defines a plurality of conductive elements that are arranged about the periphery of the second interconnecting member between the first and second sides and wherein the second side of the first interconnecting member is positioned adjacent the first side of the second interconnecting member such that the plurality of conductive elements interconnect the first set of contacts on the first interconnecting member; and
- a third interconnecting member having a first and second side wherein the third interconnecting member comprises a first set of contacts formed on the first side, a second set of contacts formed on the second side, and a third set of contacts formed on the first side and wherein the second chip is positioned within the opening defined by the second interconnecting member so as to interposed between the first and third interconnecting members and so that the first set of contacts of the second chip are electrically interconnected to the first set of contacts of the third interconnecting member and the plurality of conductive elements of the second interconnecting member interconnect the third set of contacts of the third interconnecting member wherein the second set of contacts of the first and third interconnecting members is laterally displaced from the first set of contacts.

* * * * *